United States Patent [19]

Kajiwara et al.

[11] Patent Number: 5,357,124
[45] Date of Patent: Oct. 18, 1994

[54] SUPERLUMINESCENT DIODE WITH STRIPE SHAPED DOPED REGION

[75] Inventors: Kenichi Kajiwara, Kamakura; Satoshi Arimoto; Etsuji Omura, both of Itami, all of Japan

[73] Assignees: Mitsubishi Precision Co. Ltd, Kanagawa; Mitsubishi Denki Kabushiki, Tokyo, both of Japan

[21] Appl. No.: 84,952

[22] Filed: Jul. 2, 1993

[30] Foreign Application Priority Data

Jul. 22, 1992 [JP] Japan .................... 4-194393

[51] Int. Cl.$^5$ ................................ H01L 33/00
[52] U.S. Cl. ............................ 257/95; 257/96; 257/97; 257/102; 257/103; 372/45; 372/46; 372/48
[58] Field of Search ............ 257/94, 95, 96, 97, 257/103, 102; 372/45, 46, 48

[56] References Cited

U.S. PATENT DOCUMENTS

| | | | |
|---|---|---|---|
| 4,742,378 | 5/1988 | Ito et al. | 257/13 |
| 4,901,123 | 2/1990 | Noguchi et al. | 257/98 |
| 5,223,722 | 6/1993 | Nagai et al. | 257/96 |

FOREIGN PATENT DOCUMENTS 277174 3/1990 Japan .
2150079 6/1990 Japan .
31582 1/1991 Japan .
316186 1/1991 Japan .

OTHER PUBLICATIONS

Imanaka, "Cavity Length Dependence of Optical Characteristics In High Power Narrow Stripe GaAs Superluminescent Diodes", IEEE Photonics Technology Letters, vol. 2, No. 10, Oct. 1990, pp. 705-707.

Primary Examiner—William Mintel
Attorney, Agent, or Firm—Leydig, Voit & Mayer

[57] ABSTRACT

A superluminescent diode (SLD) includes a substrate, a double heterojunction structure including a first conductivity type first cladding layer, an undoped active layer, and a second conductivity type second cladding layer. A second conductivity type first diffused region having a stripe shape and a length extends from a front facet halfway to the rear facet through which current is injected into the active layer and a second conductivity type second diffused region spaced from the first diffused region extends through the second cladding layer and the active layer and into the first cladding layer between the first diffused region and the rear facet of the device. Even when operating at high light output power, light reflections are reduced so that the SLD operates with hardly any laser oscillation.

7 Claims, 8 Drawing Sheets

Prior Art
Fig. 8
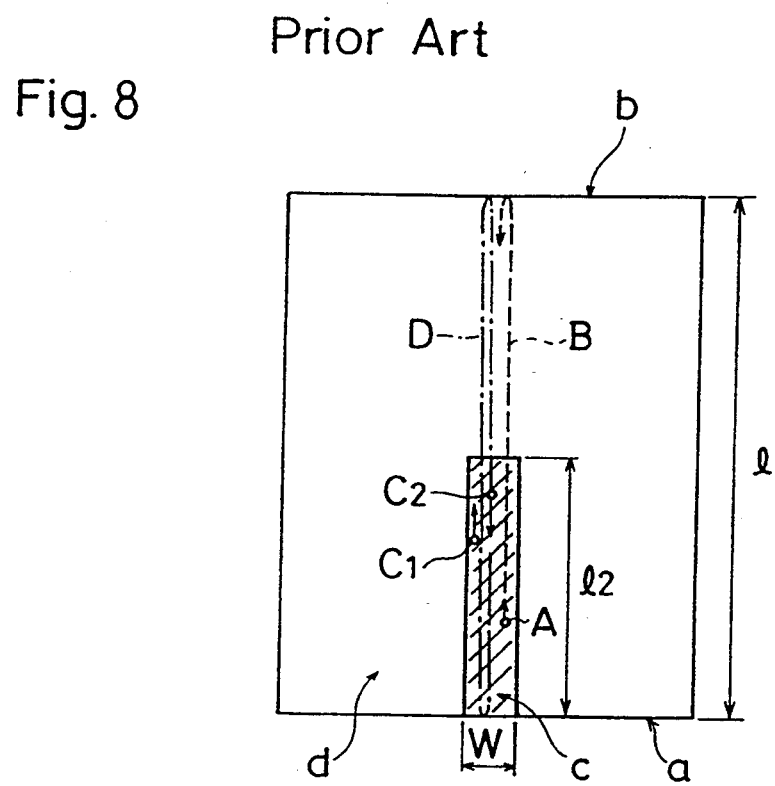
Fig. 9 (a) PRIOR ART
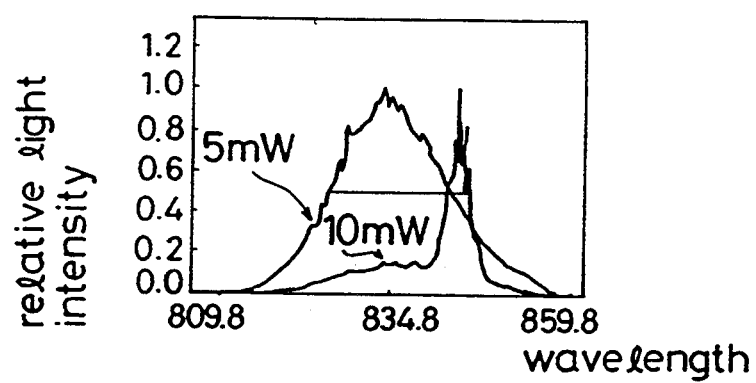
Fig. 9 (b) PRIOR ART
$\ell_1 = 500\,\mu m$
$\ell_2 = 250\,\mu m$
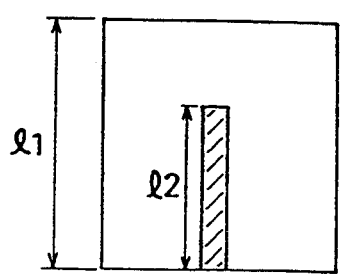

SUPERLUMINESCENT DIODE WITH STRIPE SHAPED DOPED REGION

FIELD OF THE INVENTION

The present invention relates to a superluminescent diode (hereinafter referred to as SLD) and, more particularly, to an SLD stably operating even at high power light output operation.

BACKGROUND OF THE INVENTIONS

Recently, an SLD which is between a semiconductor laser and a light emitting diode has been noticed. This light emitting device has a broad spectrum similar to the light emitting diode, and can emit light having high output power similarly to the semiconductor laser. Thus, the SLD has an advantage that light having high output power and low coherency is taken out with good directionality. With this advantage, the SLD has been recently used as a light source for a fiber gyroscope, which is incorporated in an inertial navigation system installed in aircrafts or marine vessels for obtaining position information from one minute to the next, for their destinations.

Important points in the structure and the production of the SLD reside in how to broaden spectral width of spontaneous emitted light as well as how to increase light output power while suppressing laser oscillation.

FIG. 6 is a perspective view illustrating a prior art SLD of a type in which light generated in an excitation region is absorbed in non-excitation region, this type is hereinafter referred to as non-excitation region absorbing type SLD. In the figure, there are successively disposed on an n-type GaAs substrate 1, an n-type AlGaAs cladding layer 2, an undoped AlGaAs active layer 3, a p-type AlGaAs cladding layer 4 and an n-type GaAs cap layer 5. A p-side electrode 6 is disposed on the n-type GaAs cap layer 5 and an n-side electrode 7 is disposed on the substrate 1. A Zn-diffused region 8 for producing a current injected region in the undoped AlGaAs active layer 3, reaches from the n-type GaAs cap layer 5 to the p-type AlGaAs cladding layer 4. This Zn-diffused region 8, as illustrated in FIG. 7, a plan view of SLD in FIG. 6, is disposed perpendicular to a front facet (a) in the element length direction, and the other end opposite to the front facet (a), does not reach the rear facet (b).

Next, a description is given of the operations.

When a forward bias voltage is applied to p-n junction of the SLD, i.e., a positive voltage is applied to the p-side electrode 6 and a negative voltage to the n-side electrode 7, electrons and holes are injected into a region of the active layer 3 directly below the Zn-diffused region 8, radiative recombination electrons and holes occur, and spontaneous and stimulated light is emitted from the facet (a).

As for this non-excitation region absorbing type SLD, FIG. 8 is a diagram illustrating light generated in an excitation region (c) inside the active layer 3. For example, it is supposed that light ($c_1$), which is generated in the current injected region directly below the Zn diffused region 8 inside the element, i.e., the excitation region (c), having a directionality perpendicular to the rear facet (b), travels in the perpendicular direction (D) and is reflected at the rear surface (b) and return to the excitation region (c). Then, this light ($c_1$) is synthesized with light ($c_2$) having a directionality perpendicular to the front facet (a) in the region (c), and the synthesized light is amplified and reaches the front facet (a). This amplified light is again reflected at the facet (a) and returns to the excitation region (c), and is amplified. By repeating these reflections and amplifications, coherent light is generated, resulting in laser oscillation. Once laser oscillation occurs, it is impossible to obtain low coherency light with good directionality. In order to prevent such laser oscillation, the SLD is a non-excitation region absorbing type structure, in which a non-excitation region (d) is produced in a portion from an end of the excitation region (c) opposite to the front facet (a), reaching the rear facet (b) with the stripe shaped Zn diffused region 8 shortened. In this structure, the light generated in the excitation region (c), including the light reflected at the facet (a) and amplified in the excitation region (c), is absorbed in the non-excitation region (d). As illustrated in the figure, while light (A) having a directionality perpendicular to the rear facet (b) travels in the perpendicular direction (B) and is reflected at the rear surface (b), this light (A) is absorbed in the non-excitation region (d), without returning to the excitation region (c). Thus, spontaneous and stimulated light are emitted from the facet (a).

FIG. 9(a) shows a spectrum of light produced by a non-excitation region absorbing type SLD of FIG. 9(b), having a resonator length ($l_1$) of 500 microns, a Zn diffused region length ($l_2$) of 250 microns, and a Zn diffused region width (W) of 5 microns.

In the prior art non-excitation region absorbing type SLD constituted as described above, while, in operating at low power light output such as 5 mW, a broad spectrum is obtained as shown in FIG. 9(a), and in operating at high power light output such as 10 mW, the energy amount of light generated by radiative recombinations in the excitation region increases, and the degree or amount of the light which is reflected at the facet (a) and is amplified in the excitation region (c) of FIG. 8 increases. Therefore, even if that light is absorbed in the non-excitation region, it is not absorbed sufficiently, and the reflections and amplifications of the light having directionality perpendicular to the facet are repeated, unfavorably resulting in laser oscillation as shown in FIG. 9(a)

As one that solves this problem, another prior art SLD is disclosed in Japanese Published Patent Application No.3-16186 which is also illustrated in FIG. 10. As shown in FIG. 10, on the surface of a p-type GaAs substrate 21, there are successively grown a p-type $Al_{x1}Ga_{(1-x1)}As$ cladding layer 22, a p-type $Al_{x2}Ga_{(1-x2)}As$ active layer 23, an n-type $Al_{x1}Ga_{(1-x1)}As$ cladding layer 24 and an n-type $Al_{x3}Ga_{(1-x3)}As$ layer 25, by epitaxial growth. Then, about one-third of the element length from the rear facet of these layers are etched away up to reaching the substrate 21. Further, an n-type $Al_{x4}Ga_{(1-x4)}As$ layer 26 having an energy band gap larger than that of the active layer 23 and an n-type GaAs contact layer 27 are laminated by epitaxial growth, and a U-shaped $Al_2O_3$ insulating film 28 in a stripe shape, which stripe extents from the front facet in a shorter length than the active layer 23, is produced on the contact layer 27. Then, an electrode 29 and an electrode 30 are respectively disposed on the top and rear surfaces of the element, respectively, and low reflectance coating films 31 and 32 are coated onto the front and rear facets of the device, respectively.

In the above-described construction, when a bias voltage is applied between the upper and lower electrodes 29 and 30, a current is injected into a stripe part 29a whereon the Al$_2$O$_3$ insulating film 28 is not disposed, and light emission starts in the active layer 23 at this region. When a larger current is injected, the device produces gain, generating stimulated emission light. In this construction, since the n-type Al$_{x4}$Ga$_{(1-x4)}$As layer 26 is disposed between the active layer and the rear facet of the chip, a light wave traveling toward the rear facet in the active layer 23 is emitted into the semiconductor layer 26 from a rear end of the active layer, and a portion of the emitted light is reflected at the rear facet of the chip and returns to the active layer. In the emission into the semiconductor layer 26, the light is widely diffused, and the portion of the light returning into the active layer is quite small, suppressing laser oscillation even at high power light output operation.

In this prior art SLD, however, production cost is increased, because two epitaxial processes are required, and further, reliability is lowered to a great extent because the regrowth interface is likely to be deteriorated.

SUMMARY OF THE INVENTION

It is an object of the present invention to provide an SLD with stable operation and little laser oscillation even at high power light output operation.

Another object of the present invention is to provide a method for producing such an SLD simply and at low cost with high reliability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, a superluminescent diode includes a double heterojunction structure comprising a first conductivity type first cladding layer, an undoped active layer and a second conductivity type second cladding layer, the second conductivity type being opposite the first conductivity type, which layers are successively disposed on a substrate in this order, and a second conductivity type first diffused region of a stripe shape having a length from a front facet halfway toward a rear facet, through which a current is injected into the active layer. Further, a second conductivity type or first conductivity type second diffused region reaches the first cladding layer through the active layer and the second cladding layer in at least part of a region extending from a position having a predetermined distance from a current injected region formed by the first diffused region to the rear facet of the element. Therefore, the SLD includes an impurity diffused region in a portion of an active layer in a non-excitation absorption region of the prior art non-excitation region absorbing type SLD, wherein the energy band gap of the active layer in the absorption region is smaller than that of the active layer in an excitation region, and an absorption coefficient of the non-excitation absorption region is equivalently heightened. As a result, an SLD even operating at high light power output, has reduced reflection of light resulting in a stable operation with little laser oscillation According to a second aspect of the present invention, a method of producing a superluminescent diode includes, successively growing on a semiconductor substrate, a first conductivity type first cladding layer, an undoped active layer, a second conductivity type second cladding layer, and a first conductivity type cap layer, etching away a portion of the cap layer and a portion of the second cladding layer to half of the depth of the second cladding layer, forming a second conductivity type first diffused region of a stripe shape so as to reach from the cap layer to the second cladding layer, and forming a second conductivity type or first conductivity type second diffused region in at least a portion within a region extending from a position having a predetermined distance from the current injected region to the rear facet, which diffused region reaches from the second cladding layer through the active layer to the first cladding layer, and forming electrodes on the cap layer and on the rear surface of the substrate, respectively. Therefore, the diffused region of the non-excitation absorption region is formed without an additional diffusion process and diffusion depth is easily controlled.

BRIEF DESCRIPTION OF THE DRAWINGS

FIG. 8 is a diagram illustrating the behavior of the light generated in an excitation region inside an active layer of the prior art non-excitation region absorbing type SLD.

FIGS. 9(a) and 9(b) are diagrams for explaining the spectrum of the output light of the prior art non-excitation region absorbing type SLD.

DETAILED DESCRIPTION OF THE PREFERRED EMBODIMENT

An embodiment of the present invention will be described in detail with reference to the drawings.

Figure 1:
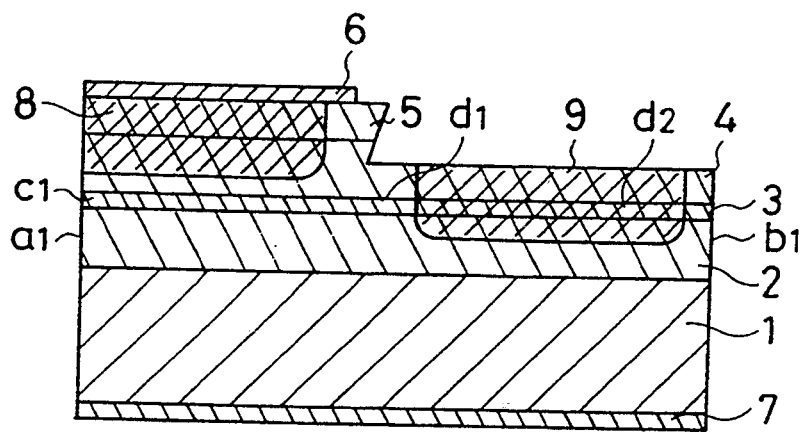
FIG. 1(a) and FIG. 1(b) are a cross sectional view and a perspective view illustrating an SLD in accordance with an embodiment the present invention.
Figure 1:
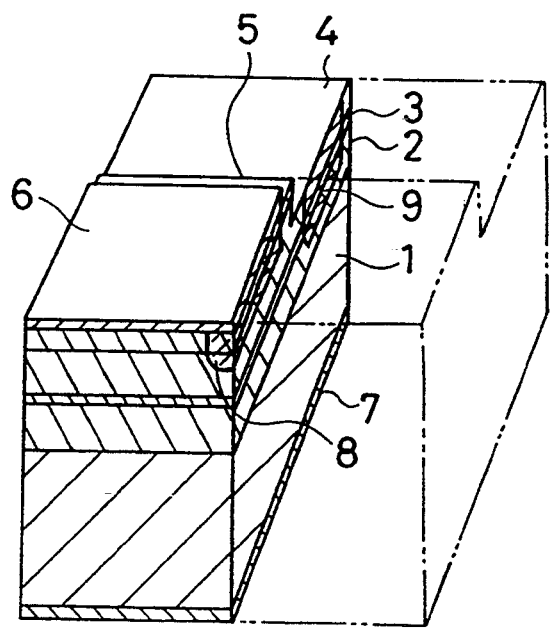
Figure 2:
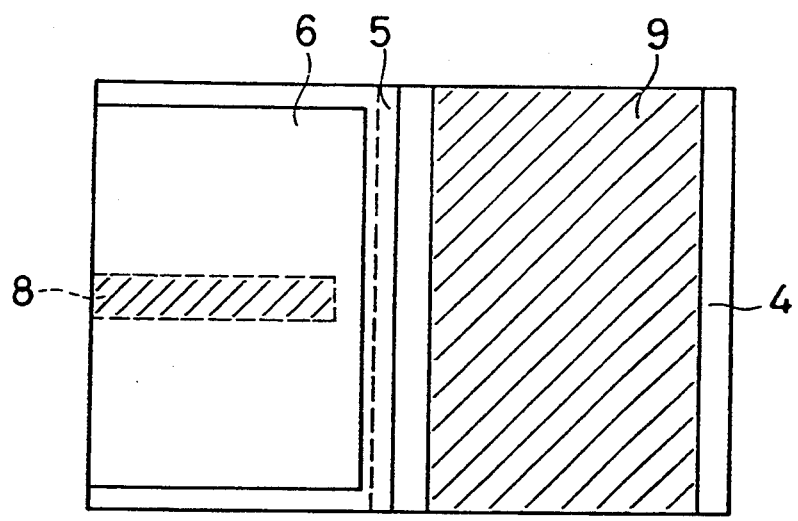
FIG. 2 is a top plan view illustrating the SLD in accordance with the embodiment of the present invention.

FIG. 1(a) is a cross sectional view illustrating an SLD in accordance with an embodiment of the present invention, FIG. 1(b) is a perspective view illustrating the SLD and FIG. 2 is a top plan view illustrating the SLD.

In the figures, there are successively grown on an n-type GaAs substrate 1, an n-type AlGaAs cladding layer 2, an undoped AlGaAs active layer 3, a p-type AlGaAs cladding layer 4 and an n-type GaAs cap layer 5. A portion in the lateral direction of the n-type GaAs cap layer 5 and of the p-type AlGaAs cladding layer 4 intermediate in the depth direction of the layer 4 are removed, and a p-side electrode 6 is disposed on the remaining n-type GaAs cap layer 5 and an n-side electrode 7 is disposed on the n-type GaAs substrate 1. A Zn-diffused region 8 constituting a current injected region for injecting a current into the undoped AlGaAs active layer 3 is provided reaching from the n-type GaAs cap layer 5 into the p-type AlGaAs cladding layer 4. A Zn-diffused region 9 constituting a non-excitation diffusion and absorption region in the undoped AlGaAs active layer 3 is provided reaching from the p-type AlGaAs cladding layer 4 through the undoped AlGaAs active layer 3 into the n-type AlGaAs cladding layer 4.

Next, a method for producing the SLD embodiment of FIG. 1($a$) will be described in detail with reference to FIGS. 3($a$) to 3($d$).

Figure 3:
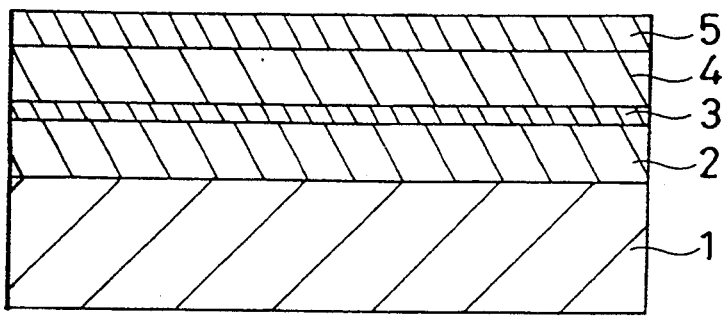
FIGS. 3(a) to 3(d) across sectional views illustrating process steps of a method for producing the SLD of FIG. 1(a).
Figure 3:
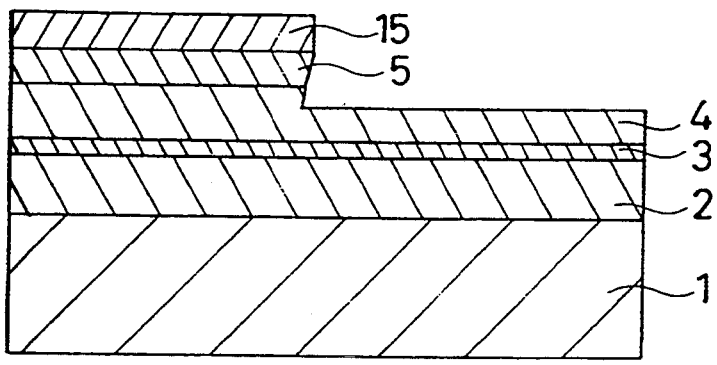
Figure 3:
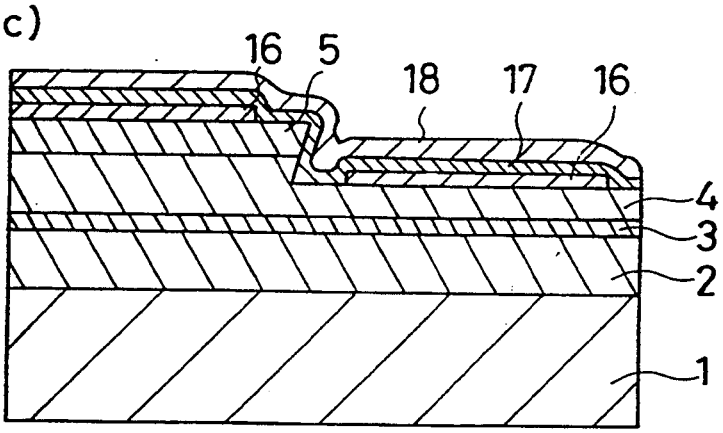
Figure 3:
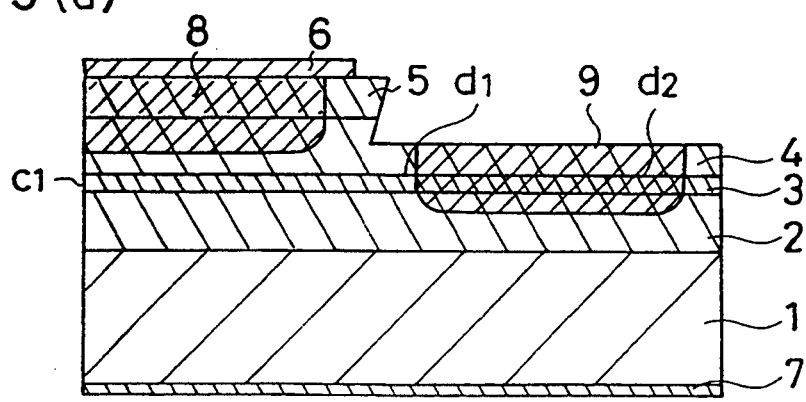

First, as shown in FIG. 3($a$), by a crystal growth method such as MOCVD (metal organic chemical vapor deposition) or MBE (molecular beam epitaxy), there are successively grown on the n-type GaAs substrate 1, the n-type AlGaAs cladding layer 2 about 1.5 microns thick, the undoped AlGaAs active layer 3 0.08 to 0.1 micron thick, the p-type AlGaAs cladding layer 4 about 1.5 microns thick and the n-type GaAs cap layer 5 about 1 micron thick.

Secondly, as shown in FIG. 3($b$), photoresist 15 is deposited on the n-type GaAs cap layer 5 to cover half of the cap layer 5 from the front facet. Employing the photoresist 15 as a mask, a portion in the lateral direction of the n-type GaAs cap layer 5 and a portion in the lateral direction of the p-type AlGaAs cladding layer 4 through half the thickness of the layer 4, are etched away. In this embodiment, a mixture of tartaric acid and hydrogen peroxide in the ratio of 5:1 is employed as an etchant, and about 1.5 microns of the semiconductor layers are etched away from the surface of the cap layer 5.

Thirdly, as shown in FIG. 3($c$), after removing the photoresist 15, a ZnO film 16 is deposited on the whole surface by sputtering or the like, and photolithography and etching are employed to leave a portion of the ZnO film on a region where Zn is to be diffused. Then, an $SiO_2$ film 17 and an SiN film 18 are deposited on the whole surface. Using these films as protecting films, the element is heated to 650° to 700° C., whereby Zn atoms are diffused into the semiconductor layers to a depth of 1.5 microns, by thermal diffusion. As a result, a stripe shaped Zn diffused region 8 is produced having a width of 5 to 10 microns and a length of 200 to 250 microns, which reaches from the cap layer 5 to halfway through of the cladding layer 4. At the same time, at a position having a predetermined distance from the diffused region 8 to the rear facet, there is produced a Zn diffused region 9, which reaches from the cladding layer 4 through the active layer 3 to halfway through the cladding layer 2.

After producing these diffused regions, as shown in FIG. 3($d$), the ZnO pattern 16, $SiO_2$ film 17, and SiN film 18 are removed, the p-side electrode 6 is formed on the cap layer 5 and the n-side electrode 7 is formed on the rear surface of the substrate 1, completing the element.

Next, description is given of the operation.

When a forward bias voltage is applied to the p-n junction of the SLD, i.e., a positive voltage is applied to the p-side electrode 6 and a negative voltage to the n-side electrode 7, electrons and holes are injected into a region of the active layer 3 directly below the Zn-diffused region 8, radiative recombinations of electrons and holes occurs, and spontaneous light and stimulated light are emitted from the facet of the element.

Figure 4:
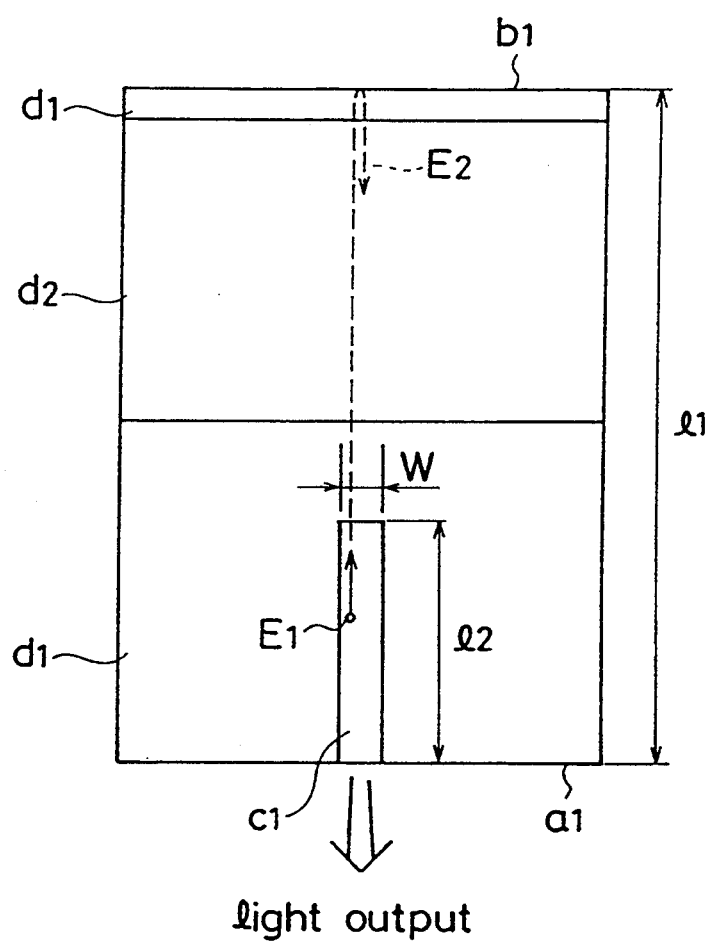
FIG. 4 is a schematic plan view illustrating the behavior of the light generated in an excitation region in an active layer of the SLD of the embodiment of FIG. 1(a).

FIG. 4 is a diagram illustrating the behavior of the light which is generated in an excitation region ($c_1$) in the active layer 3 of the SLD. In the figure, the region except the excitation region ($c_1$) is a region into which current is not injected, and reference characters ($d_1$) and ($d_2$) designate non-excitation regions having a light absorbing function. Here, region ($d_1$) is a region of the active layer 3 where Zn atoms are not diffused, and region ($d_2$) is a region of the active layer 3 where Zn atoms are diffused. In the non-excitation absorption region ($d_1$) and the non-excitation diffusion and absorption region ($d_2$), reflected light ($E_2$) of the light ($E_1$) that has a directionality perpendicular to the rear facet (also, to the front facet) is absorbed, reducing the repeated reflections and amplification. As a result, even when operating at high light output power, laser oscillation does not occur, resulting in a broad light emission spectrum.

Figure 5:
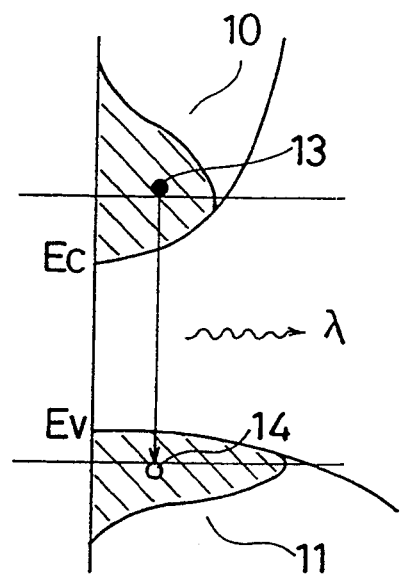
FIGS. 5(a) to 5(c) are energy band diagrams of the active layer in an excitation region, in a non-excitation absorption region, and in a non-excitation diffusion and absorption region of the SLD of the embodiment of FIG. 1(a).
Figure 5:
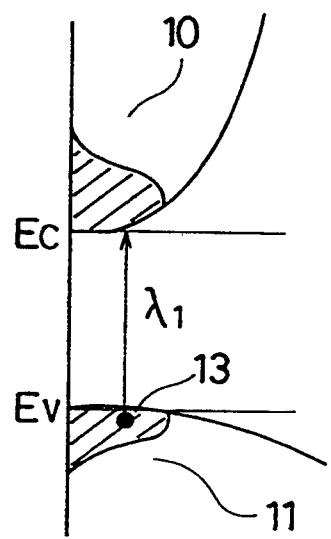
Figure 5:
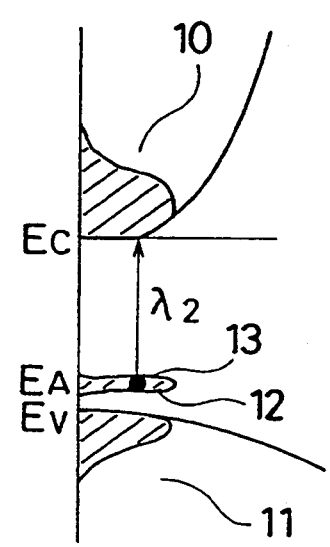
Figure 6:
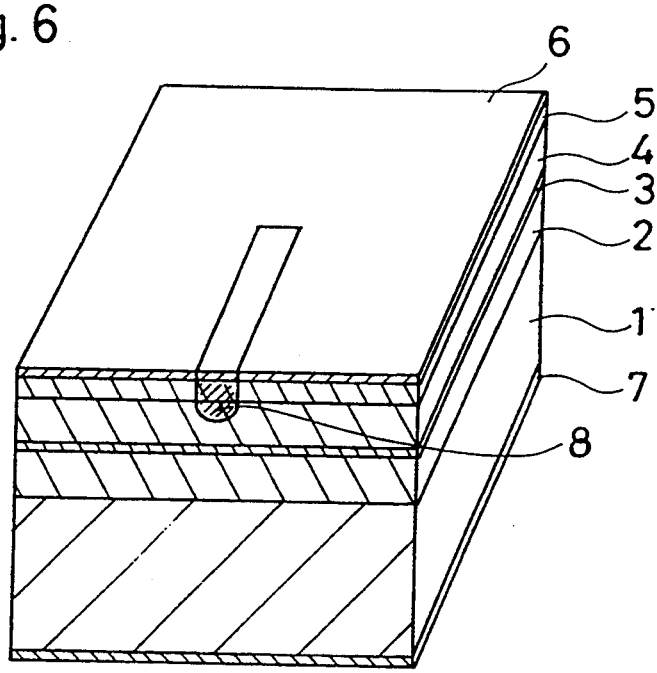
FIG. 6 is a perspective view illustrating a prior art non-excitation region absorbing type SLD.
Figure 7:
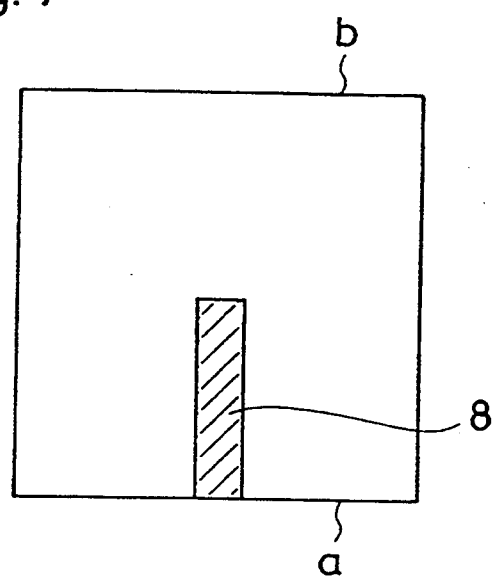
FIG. 7 is a top plan view illustrating the prior art non-excitation region absorbing type SLD.
Figure 10:
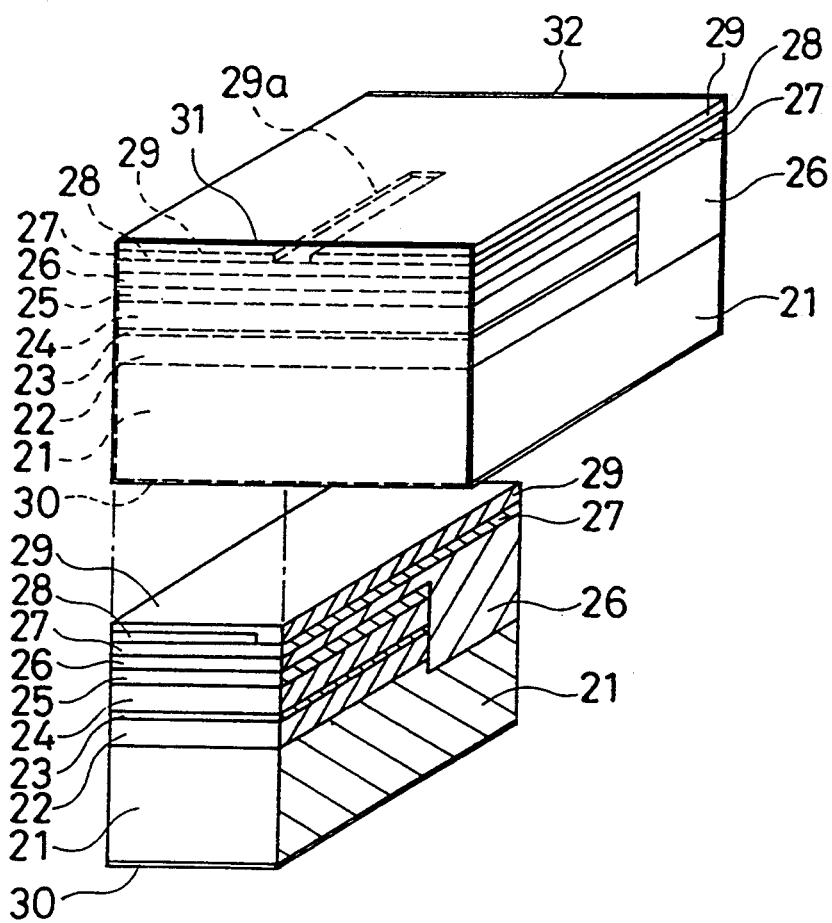
FIG. 10 is a perspective view also illustrating a cross section of another prior art SLD.

Here, a description is given of the mechanism in which the light generated in the excitation region ($c_1$) is absorbed in the non-excitation absorption region ($d_1$) and the non-excitation diffusion and absorption region ($d_2$). FIG. 5($a$) shows an energy band diagram of the active layer in an excitation region of the SLD, FIG. 5($b$) shows a band diagram in a non-excitation absorption region, and FIG. 5($c$) shows a band diagram in a non-excitation diffusion and absorption region thereof. In the figures, reference character ($E_C$) designates energy at a lower edge of a conduction band 10, character ($E_V$) designates an energy at an upper edge of a valence band 11, and character ($E_A$) designates an energy of an acceptor level 12 produced by the diffused impurity, i.e., Zn atom in this embodiment. Reference character ($\lambda$) designates the wavelength of the light generated by radiative recombinations occurring in the excitation region ($c_1$), and characters ($\lambda_1$) and designate ($\lambda_2$)the wavelengths of the light absorbed in the non-excitation absorption region ($d_1$) and the non-excitation diffusion and absorption region ($d_2$), respectively.

As shown in FIG. 5($a$), since a current is injected into the excitation region ($c_1$), electrons 13 are accumulated in the conduction band 10 and holes 14 in the valence band 11. The accumulation of electrons 13 and holes 14 are represented by oblique lines in the figure. The dominant radiative recombinations occurring in the excitation region ($c_1$) are from transitions between the peak point in the distribution of the electrons 13 in the conduction band 10 and the peak point in the distribution of holes 14 in the valence band 11, i.e., radiative recombinations which generate light having a wavelength ($\lambda$), and this results in a wavelength broadening in the spectrum configuration with ($\lambda$) as a center thereof.

On the other hand, as shown in FIGS. 5($b$) and 5($c$), because no current is injected into the non-excitation regions ($d_1$) and ($d_2$), electrons 13 are hardly accumulated in the conduction band 10 while the holes 14 are hardly accumulated in the valence band 11 and the acceptor level 12. In other words, the valence band 11 and the acceptor level 12 are full of electrons 13, and there are few electrons 13 in the conduction band 10. The light absorption is caused by electrons 13 in the valence band 11 and the acceptor level 12 being raised to the conduction band 10 by the light energy. When fewer electrons 13 are in the conduction band 10 and more electrons 13 in the valence band 11 and the acceptor level 12, more light is absorbed. In the non-excitation regions ($d_1$) and ($d_2$), light having a wavelength corresponding to an energy larger than the energy band gap of the regions i.e., light having a wavelength corresponding to an energy larger than the energy difference between the lower edge of the conduction band 10 and the upper edge of the valence band 11 in the region ($d_1$), and light having a wavelength corresponding to an energy larger than the energy difference between the lower edge of the conduction band 10 and the upper edge of the acceptor level 12 in the region ($d_2$), is absorbed. Since the energy of the light generated in the excitation region ($c_1$) is always larger than the energy difference between the lower edge of the conduction band 10 and the upper edge of the valence band 11, that light is absorbed in the non-excitation regions ($d_1$) and ($d_2$).

Next, considerations on the degree of the light absorption in the non-excitation regions ($d_1$) and $d_2$) are given.

According to "Semiconductors" by R. A. Smith (1959, Cambridge University Press), with respect to the light of photon energy (E) in the vicinity of the band gap energy (Eg), the absorption coefficient ($\alpha_0$) is represented as follows:

$$\alpha_0 \propto (E-E_g)^{1/2} \quad (1)$$

Therefore, suppose that the absorption coefficient of the non-excitation regions ($d_1$), ($d_2$) are ($\alpha_1$), ($\alpha_2$) respectively, the respective absorption coefficients are represented as follows:

$$\alpha_1 \propto (E-E_C+E_V)^{1/2} \quad (2)$$

$$\alpha_2 \propto (E-E_C+E_A)^{1/2} \quad (3)$$

From the above-described formulae, a relation of $\alpha_1 < \alpha_2$ is attained, meaning that the degree of light absorption is larger in the non-excitation region ($d_1$) than in the non-excitation region ($d_2$).

As described above, according to an embodiment of the present invention, a stripe extending from a front facet ($a_1$) halfway toward a rear facet ($b_1$) is provided, non-excitation regions ($d_1$) and ($d_2$) are provided at the rear facet ($b_1$), and impurities are diffused into the active layer to provide a large absorption coefficient in the region ($d_2$) Therefore, repeated reflection and amplification of the light having a directionality perpendicular to the facets ($a_1$) and ($b_1$) is reduced and actual reflections at the rear facet are reduced, resulting in an SLD which hardly has a laser oscillation even at high light output power operation, and, therefore, provides stable operation.

In addition, according to this embodiment, Zn diffusion into the non-excitation region ($d_2$), extending from a p-type AlGaAs cladding layer 4, through an undoped AlGaAs active layer 3 and halfway through the n-type AlGaAs cladding layer 2, and Zn diffusion into the excitation region ($c_1$), extending through the n-type GaAs cap layer 5 halfway through the cladding layer 4 in a stripe shape are carried out at the same time. Therefore, without adding a diffusion process for forming the non-excitation region ($d_2$), the diffused regions are easily produced and the depth of the diffused region is also easily controlled, producing an SLD having a desired characteristics with high reliability.

While, in the above-described embodiment, the Zn diffused regions 8 and 9 are produced by solid phase diffusion, the regions can be produced by gas phase diffusion, ion implantation or the like, employing a SiN mask.

While Zn is employed as the p-type impurity which is diffused into the region 9 of the active layer, Si or Se may be employed as n-type impurity, with the same effects as the above-described embodiment.

Further, while in the above-described embodiment, Zn is employed as the p-type impurity which is diffused into the diffusion region 8, Si or Se can be employed as n-type impurity which is diffused into the region 8, inverting the conductivity types of the semiconductor layers. Further, the dopant impurity in the region 9 in the active layer, Zn can be employed as p-type impurity, and Si or Se can be employed as n-type impurity, properly determining carrier concentrations of respective layers. In both cases, the same effects as described above are expected.

What is claimed is:

1. A superluminescent diode comprising:
   a substrate;
   a double heterojunction structure comprising a first conductivity type first cladding layer, an undoped active layer, and a second conductivity type second cladding layer, said second conductivity type being opposite said first conductivity type, Said layers being successively disposed on said substrate, said double hetero heterojunction structure having opposed front and rear facets transverse to said layers;
   a second conductivity type first diffused region in said second cladding layer having a stripe shape and a length extending from the front facet halfway toward the rear facet through which a current is injected into said active layer; and
   a second conductivity type second diffused region spaced from said first diffused region, disposed between the rear facet and said first diffused region, and extending through said second cladding layer and said active layer and into said first cladding layer.

2. The superluminescent diode of claim 1, wherein said substrate comprises GaAs, said first and second cladding layers comprise AlGaAs, and said active layer comprises AlGaAs having an energy band gap smaller than the energy band gaps of said cladding layers.

3. The superluminescent diode of claim 1, including a first conductivity type cap layer disposed on said second cladding layer wherein said first diffused region extends through said cap layer into said second cladding layer.

4. The superluminescent diode of claim 2 wherein said first and second diffused regions contain Zn as a dopant impurity.

5. A superluminescent diode comprising:
   a substrate;
   a double heterojunction structure comprising a first conductivity type first cladding layer, an undoped active layer, and a second conductivity type second cladding layer successively disposed on the substrate, the double heterojunction structure having opposed front and rear facets transverse to the first cladding, active, and second cladding layers;
   a second conductivity type first impurity doped region having a stripe shape and extending from the front facet toward, but not reaching, the rear facet in the second cladding layer;

a second conductivity type second impurity doped region spaced from the first impurity doped region, disposed between the first impurity doped region and the rear facet, and extending through the second cladding layer and the active layer and into the first cladding layer; and a first electrode disposed on the substrate and a second electrode disposed on the second cladding layer contacting the first impurity doped region but not the second impurity doped region.

6. The superluminescent diode of claim 5 including a second conductivity type cap layer interposed between and contacting the second cladding layer and the second electrode and containing part of the first impurity doped region.

7. The superluminescent diode of claim 5 wherein the second impurity doped region extends across a width of the diode transverse to the first impurity doped region.

* * * * *